(12) United States Patent
Ooyabu et al.

(10) Patent No.: US 7,465,884 B2
(45) Date of Patent: Dec. 16, 2008

(54) WIRED CIRCUIT BOARD

(75) Inventors: Yasunari Ooyabu, Osaka (JP); Jun Ishii, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/785,873

(22) Filed: Apr. 20, 2007

(65) Prior Publication Data

US 2007/0246247 A1 Oct. 25, 2007

Related U.S. Application Data

(60) Provisional application No. 60/847,114, filed on Sep. 26, 2006.

(30) Foreign Application Priority Data

Apr. 20, 2006 (JP) .............................. 2006-116975

(51) Int. Cl.
*H05K 1/00* (2006.01)
(52) U.S. Cl. .................... 174/255; 360/245.9
(58) Field of Classification Search .............. 174/250, 174/254; 360/245.9
See application file for complete search history.

(56) References Cited

U.S. PATENT DOCUMENTS

| 6,316,734 | B1* | 11/2001 | Yang | ........................... 174/256 |
| 6,459,043 | B1* | 10/2002 | Dodsworth | ................. 174/254 |
| 2002/0139569 | A1 | 10/2002 | Dodsworth | |
| 2003/0151902 | A1 | 8/2003 | Kageyama et al. | |
| 2004/0221447 | A1 | 11/2004 | Ishii et al. | |
| 2005/0117257 | A1 | 6/2005 | Thaveeprungsriporn et al. | |
| 2006/0187587 | A1* | 8/2006 | Arai et al. | ................. 360/245.9 |
| 2006/0269730 | A1 | 11/2006 | Ishii et al. | |

FOREIGN PATENT DOCUMENTS

| JP | 04-199790 | 7/1992 |
| JP | 2004-035825 | 2/2004 |
| JP | 2004-158480 | 6/2004 |
| JP | 2004-335700 | 11/2004 |
| JP | 2006-093228 | 4/2006 |
| JP | 2006-332549 | 12/2006 |

* cited by examiner

*Primary Examiner*—Ishwar I. B. Patel
(74) *Attorney, Agent, or Firm*—Jean C. Edwards, Esq.; Akerman Senterfitt (57) ABSTRACT

The wired circuit board includes a metal supporting board, an insulating base layer formed on the metal supporting board, a conductive pattern formed on the insulating base layer, a semiconductive layer formed on the insulating base layer so as to cover the conductive pattern, and a ground connecting portion formed on the metal supporting board to be in contact with the metal supporting board and the semiconductive layer.

5 Claims, 4 Drawing Sheets

WIRED CIRCUIT BOARD

CROSS REFERENCE TO RELATED APPLICATIONS

This application claims the benefit of U.S. Provisional Application No. 60/847,114, filed on Sep. 26, 2006, and claims priority from Japanese Patent Application No. 2006-116975, filed on Apr. 20, 2006, the contents of which are herein incorporated by reference in their entirety.

BACKGROUND OF THE INVENTION

1. Field of the Invention

The present invention relates to a wired circuit board. More particularly, the present invention relates to a wired circuit board for mounting an electronic component, such as a suspension board with circuit.

2. Description of the Related Art

A wired circuit board such as a suspension board with circuit includes, for example, a metal supporting board of stainless steel foil or the like, an insulating base layer of polyimide resin or the like, which is formed on the metal supporting board, a conductive pattern of copper foil or the like, which is formed on the insulating base layer, and an insulating cover layer of polyimide resin or the like, to cover the conductive pattern on the insulating base layer. The wired circuit boards of this type are widely used in a variety of fields of electric and electronic equipment.

In such wired circuit board, in order to prevent electronic components mounted thereon from electrostatic discharge damage, there has been proposed that a conductive polymer layer is formed on the cover layer to remove static electricity charged via the conductive polymer layer (cf., Japanese Unexamined Patent Publication No. 2004-158480).

SUMMARY OF THE INVENTION

However, the conductive polymer layer formed on the cover layer, which has been described in Japanese Unexamined Patent Publication No. 2004-158480 above is insufficient alone for removing the static electricity. Therefore, the electrostatic breakdown of the electronic components mounted may not be always prevented.

For this reason, for example, in a suspension board with circuit, a proposal has been considered that a semiconductive layer is formed so as to be continuous with the surfaces of a conductive pattern, an insulating base layer, and a metal supporting board, so that the semiconductive layer can remove the static electricity charged on the conductive pattern.

However, in the case of using this suspension board with circuit under a high temperature and high humidity atmosphere, a direct contact of the semiconductive layer and the metal supporting board causes dew condensation or the like on the metal supporting board, which may corrode the metal supporting board.

It is an object of the present invention to provide a wired circuit board capable of efficiently removing static electricity, and preventing corrosion of a metal supporting board under a high temperature and high humidity atmosphere.

The wired circuit board of the present invention includes a metal supporting board, an insulating base layer formed on the metal supporting board, a conductive pattern formed on the insulating base layer, a semiconductive layer formed on the insulating base layer so as to cover the conductive pattern, and a ground connecting portion formed on the metal supporting board so as to be in contact with the metal supporting board and the semiconductive layer.

The wired circuit board of the present invention includes a semiconductive layer formed so as to cover a conductive pattern, and a ground connecting portion formed so as to be in contact with a metal supporting board and a semiconductive layer.

Accordingly, the conductive pattern is electrically connected with the metal supporting board via the semiconductive layer and the ground connecting portion, thereby allowing to efficiently remove the static electricity charged on the conductive pattern. Besides, the semiconductive layer is electrically connected with the metal supporting board via the ground connecting portion without directly contacting the metal supporting board, thereby allowing to effectively prevent corrosion of the metal supporting board.

As a result, the electrostatic breakdown of the electronic components mounted thereon can be prevented reliably, and the corrosion of the metal supporting board under a high temperature and high humidity atmosphere can also be prevented effectively.

In the wired circuit board of the present invention, it is preferable that a base opening extending in a thickness direction is formed in the insulating base layer, and the ground connecting portion is provided in the base opening.

BRIEF DESCRIPTION OF THE DRAWINGS

(a) illustrates a step of preparing a metal supporting board.

(b) illustrates a step of forming an insulating base layer on the metal supporting board.

(c) illustrates a step of simultaneously forming a conductive pattern and a ground connecting portion.

(d) illustrates a step of forming a semiconductive layer so as to be continuous with the surfaces of a conductive pattern, an upper part of a ground connecting portion, an insulating base layer, and a metal supporting board.

(e) illustrates a step of forming an insulating cover layer on the semiconductive layer; and (f) illustrates a step of removing the semiconductive layer exposed from the insulating cover layer by etching.

DETAILED DESCRIPTION OF PREFERRED EMBODIMENTS

Figure 1:
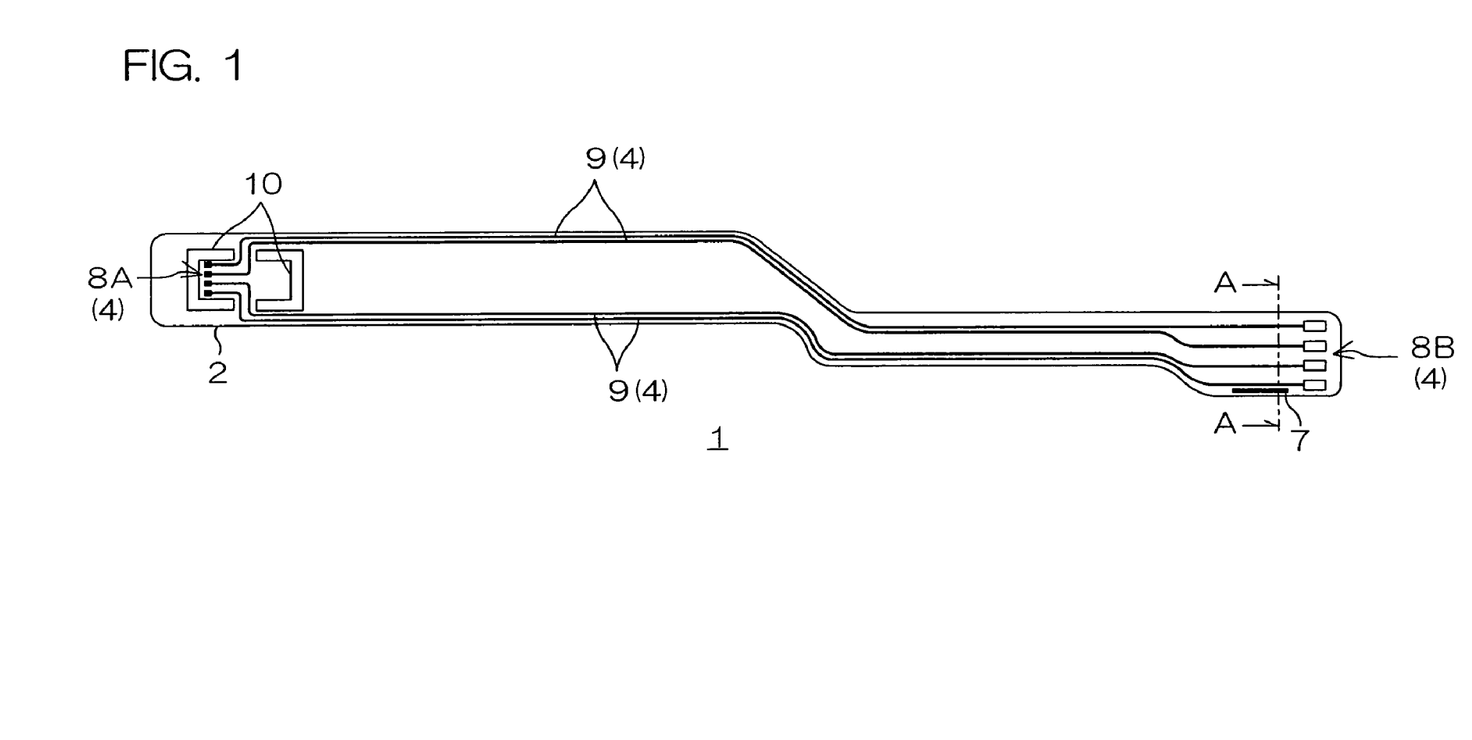
FIG. 1 is a schematic plan view illustrating a suspension board with circuit as an embodiment of a wired circuit board according to the present invention.
Figure 2:
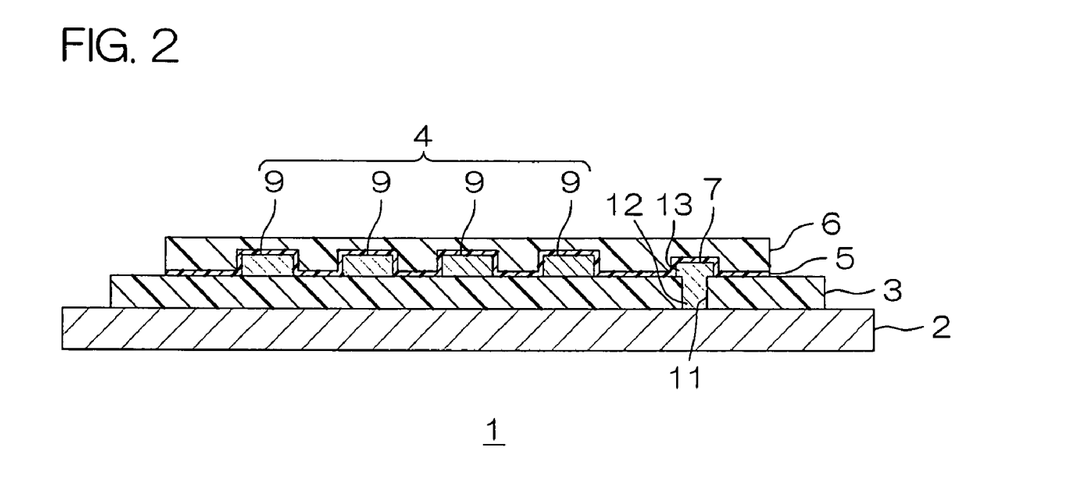
FIG. 2 is a sectional view of the suspension board with circuit taken along the line A-A shown in FIG. 1.

FIG. 1 is a schematic plan view illustrating a suspension board with circuit as an embodiment of a wired circuit board according to the present invention. FIG. 2 is a sectional view of the suspension board with circuit taken along the line A-A shown in FIG. 1. To clarify a relative position of a conductive pattern 4 to a metal supporting board 2, an insulating base layer 3, a semiconductive layer 5, and an insulating cover layer 6, which are mentioned later, are omitted in FIG. 1.

In FIG. 1, a suspension board with circuit 1 comprises a metal supporting board 2 mounted on a hard disk drive. The conductive pattern 4 for connecting a magnetic head (not shown) and (an external) read/write board is formed integrally on the metal supporting board 2. The metal supporting board 2 supports the magnetic head mounted thereon, while holding a minute gap between the magnetic head and a magnetic disk against an air flow caused when the magnetic head and the magnetic disk travel relatively to each other.

The conductive pattern 4 comprises magnetic-head-side connecting terminal portions 8A, external connecting external portions 8B, and wires 9 for connecting therebetween, which are formed integrally and continuously.

The plurality of wires 9 are provided along a longitudinal direction of the metal supporting board 2 and are arranged in parallel at spaced intervals with respect to the widthwise direction (the direction orthogonal to the longitudinal direction of the metal supporting board 2; hereinafter may be simply referred to as "widthwise") of the metal supporting board 2.

The magnetic-head-side connecting terminal portions 8A are arranged at a front end portion of the metal supporting board 2 in parallel as a broad land to connect with front end portions of the wires 9, respectively. Terminal portions (not shown) of the magnetic head are connected to the magnetic-head-side connecting terminal portions 8A.

The external connecting external portions 8B are arranged at a rear end portion of the metal supporting board 2 in parallel as a broad land to connect with rear end portions of the wires 9, respectively. Terminal portions (not shown) of the read/write board are connected to the external connecting external portion 8B.

The metal supporting board 2 has a gimbal 10 formed at a front end portion thereof for mounting the magnetic head. The gimbal 10 is formed by cutting out the metal supporting board 2 to sandwich the magnetic-head-side connecting terminal portions 8A therebetween in the longitudinal direction.

The suspension board with circuit 1 comprises the metal supporting board 2, the insulating base layer 3 formed on the metal supporting board 2, the conductive pattern 4 formed on the insulating base layer 3, the ground connecting portion 7 formed on the metal supporting board 2, the semiconductive layer 5 formed on the insulating base layer 3 so as to cover the conductive pattern 4 and the ground connecting portion 7, and the insulating cover layer 6 formed on the semiconductive layer 5, as shown in FIG. 2.

The metal supporting board 2 is formed from a flat thin plate extending in the longitudinal direction corresponding to the outer shape of the suspension board with circuit 1 described above.

The length (length in longitudinal direction) and width (length in widthwise) of the metal supporting board 2 are appropriately selected depending on the purpose and application.

The insulating base layer 3 is formed on the metal supporting board 2 in a pattern in which an portion where the ground connecting portion 7 is formed and a peripheral end portion of the metal supporting board 2 are exposed, corresponding to a portion where the conductive pattern 4 is formed.

More specifically, to form the ground connecting portion 7, the insulating base layer 3 has a base opening 11 formed on one widthwise side thereof to extend through in the thickness direction, while spaced apart outward in the widthwise direction from an outermost wire 9 on a widthwise side of the conductive pattern 4.

The base opening 11 is opened in a generally rectangular shape in plane view, extending in the longitudinal direction, and is formed so as to correspond to the shape of the lower portion 12 of the ground connecting portion 7.

The length and width of the insulating base layer 3 are appropriately selected depending on the purpose and application to have the above-mentioned shape.

The conductive pattern 4 is formed on the insulating base layer 3 in a wired circuit pattern which integrally comprises the plurality of wires 9 arranged in parallel at spaced intervals as mentioned above, the magnetic-head-side connecting terminal portions 8A, and the external connecting external portions 8B connected with the front end portions and the rear end portions of the wires 9, respectively. The magnetic-head-side connecting terminal portions 8A and the external connecting external portions 8B are hereinafter simply described as "the terminal portions 8", when not particularly necessary to be distinguished.

In addition, the conductive pattern 4 is arranged on the insulating base layer 3 so that a region for forming the base opening 11 may be allocated.

Each of the wires 9 have a width in the range of, for example, 10 to 400 µm, or preferably 20 to 100 µm, and a spacing between each of the wires 9 is in the range of, for example, 10 to 400 µm, or preferably 20 to 100 µm.

Each of the terminal portions 8 has a width in the range of, for example, 40 to 200 µm, or preferably 50 to 120 µm, and a spacing between each of the terminal portions 8 is in the range of, for example, 20 to 200 µm, or preferably 40 to 120 µm.

The ground connecting portion 7 integrally and continuously comprises the lower portion 12 formed so as to be filled in the base opening 11 in the insulating base layer 3 described above, and an upper portion 13 formed so as to expand from the upper end of the lower portion 12 upward in a thickness direction of the insulating base layer 3 and toward both sides of a longitudinal direction and of a widthwise direction.

In the ground connecting portion 7, the under surface of the lower portion 12 is in contact with the metal supporting board 2.

The lower portion 12 of the ground connecting portion 7 has a width in the range of, for example, 40 to 2000 µm, or preferably 60 to 500 µm. The upper portion 13 of the ground connecting portion 7 has a width in the range of, for example, 70 to 2060 µm, or preferably 90 to 560 µm. The lengths of the lower portion 12 and the upper portion 13 of the ground connecting portion 7 are appropriately selected depending on the purpose, application, and product design.

The semiconductive layer 5 is formed on the insulating base layer 3 covered with the insulating cover layer 6, so as to cover the conductive pattern 4 and the ground connecting portion 7. That is, the semiconductive layer 5 is formed so as to be interposed between the insulating base layer 3, the conductive pattern 4, and the ground connecting portion 7, and the insulating cover layer 6.

The semiconductive layer 5 is formed so as to expose the peripheral end portion of the insulating base layer 3. More specifically, the semiconductive layer 5 is formed so as to be continuous with the upper surface and the lateral side surface of the conductive pattern 4, the upper surface and the lateral side surface of the upper portion 13 of the ground connecting portion 7, and the upper surface of the insulating base layer 3 exposed from the conductive pattern 4 and the upper portions 13 of the ground connecting portion 7 along the longitudinal and widthwise directions.

Thus, the semiconductive layer 5 contacts the conductive pattern 4, the upper portion 13 of the ground connecting portion 7, and the insulating base layer 3 on the lower side in the thickness direction, and contacts the insulating cover layer 6 on the upper side in the thickness direction.

The insulating cover layer 6 is formed on the semiconductive layer 5. More specifically, the insulating cover layer 6 is provided in the same position as the semiconductive layer 5 in plane view.

That is, the insulating cover layer 6 is formed so as to be continuous with the upper surface and the lateral side surface of the semiconductive layer 5 formed on the upper surface and the lateral side surface of the conductive pattern 4, the upper surface and the lateral side surface of the semiconductive layer 5 formed on the upper surface and the lateral side surface of the upper portion 13 of the ground connecting portion 7, and the upper surface of the semiconductive layer 5 formed on the upper surface of the insulating base layer 3 exposed from the conductive pattern 4 and the upper portion 13 of the ground connecting portion 7 along the longitudinal and widthwise directions.

In addition, the insulating cover layer 6 has an opening, though not shown, in a portion corresponding to the terminal portions 8 to expose the terminal portions 8 in the conductive pattern 4.

The length and width of the insulating cover layer 6 are appropriately selected depending on the purpose and application to have the above-mentioned shape.

In the suspension board with circuit 1, a metal plating layer, which is not shown, is formed on an upper surface of the terminal portions 8.

Figure 3:
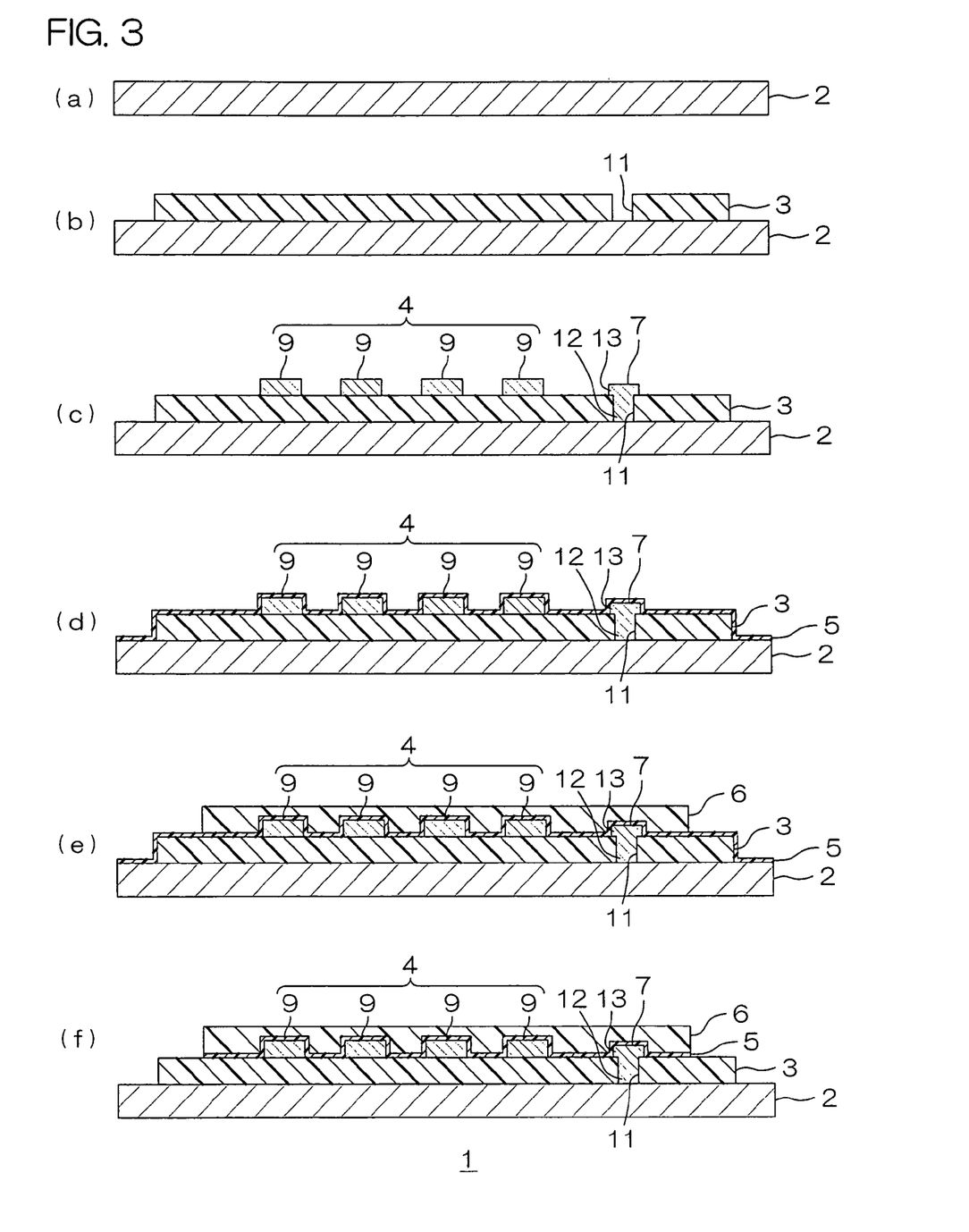
FIG. 3 is a sectional view illustrating a process of producing a suspension board with circuit shown in FIG. 2.

FIG. 3 is a sectional view illustrating the process of producing a suspension board with circuit shown in FIG. 2.

Next, a production method of this suspension board with circuit 1 is described with reference to FIG. 3.

In this method, a metal supporting board 2 is first prepared, as shown in FIG. 3(a).

A metal foil, such as a stainless steel foil, a 42-alloy foil, an aluminum foil, a copper foil, a copper-beryllium foil, or a phosphor bronze foil, is used for the metal supporting board 2. Preferably, a stainless steel foil is used. The metal supporting board 2 has a thickness in the range of, for example, 10 to 51 μm, or preferably 18 to 25 μm.

Then, in this method, the insulating base layer 3 is formed on the metal supporting board 2 to correspond to a portion where the conductive pattern 4 is formed, and to provide a pattern in which the base opening 11 is formed, as shown in FIG. 3(b).

The insulating base layer 3 is formed of resin, for example, polyimide resin, polyamide imide resin, acrylic resin, polyether nitrile resin, polyether sulfone resin, polyethylene terephthalate resin, polyethylene naphthalate resin, polyvinyl chloride resin, etc. Of these resins, polyimide resin is preferably used in terms of heat resistance.

The method for forming the insulating base layer 3 in the above-mentioned pattern is not particularly limited and a known method is used. For example, a varnish of photosensitive resin (photosensitive polyamic acid resin) is coated over a surface of the metal supporting board 2, and the coated varnish is dried to form a base coating. Subsequently, the base coating is exposed to light via a photomask, and then heated as required and developed to form the above-mentioned pattern. Then, for example, the pattern is heated at 250° C. or higher under reduced pressure to be cured (imidized).

The insulating base layer 3 thus formed has a thickness in the range of, for example, 1 to 35 μm, or preferably 5 to 12 μm.

Then, in this method, the conductive pattern 4 is formed on the insulating base layer 3 in the above-mentioned wired circuit pattern, and at the same time, the ground connecting portion 7 is formed on the metal supporting board 2 exposed from the base opening 11 in the insulating base layer 3 so that the lower portion 12 is filled in the base opening 11 in the insulating base layer 3, and so that the upper portion 13 thereof covers over the edge of the base opening 11, as shown in FIG. 3(c).

Both the conductive pattern 4 and the ground connecting portion 7 are formed of the same conductor, for example, copper, nickel, gold, solder, or alloys thereof, although preferably copper is used therefor. The conductive pattern 4 and the ground connecting portion 7 are formed on the upper surfaces of the insulating base layer 3 and metal supporting board 2 (including the portion exposed from the base opening 11 of the insulating base layer 3) by a known patterning method, such as an additive method or a subtractive method. Preferably, the conductive pattern 4 and the ground connecting portion 7 are formed in the above-mentioned pattern using the additive method.

In the additive method, a thin conductive film is first formed on the surfaces of the insulating base layer 3 and the metal supporting board 2. To form the thin conductive film, a thin chrome film and a thin copper film are laminated by sputtering method, or preferably chromium sputtering process and copper sputtering.

Then, after a plating resist is formed in a pattern reverse to the conductive pattern 4 and the ground connecting portion 7 on the upper surface of the thin conductive film, the conductive pattern 4 and the ground connecting portion 7 are formed on the upper surface of the thin conductive film exposed from the plating resist by electrolytic plating. Thereafter, the plating resist and the thin conductive film on which the plating resist is laminated are removed.

In the subtractive method, a conductive layer is first laminated on the upper surfaces of the insulating base layer 3 and the metal supporting board 2 via an adhesive layer, if required. Then, an etching resist having the same pattern as the conductive pattern 4 and the ground connecting portion 7 is formed on the conductive layer. Then, the conductive layer is etched using this etching resist as a resist, and thereafter, the etching resist is removed.

The conductive pattern 4 thus formed has a thickness in the range of, for example, 3 to 20 μm, or preferably 3 to 17 μm. The upper portion 13 of the ground connecting portion 7 has a thickness in the range of, for example, 3 to 20 μm, or preferably 3 to 17 μm. The thickness of the lower portion 12 of the ground connecting portion 7 is the same as that of the insulating base layer 3.

Then, in this method, the semiconductive layer 5 is formed so as to be continuous with the surface of the conductive pattern 4, the surface of the upper portion 13 of the ground connecting portion 7, the surface of the insulating base layer 3 exposed from the conductive pattern 4 and the upper portion 13 of the ground connecting portion 7, and the surface of the metal supporting board 2 exposed from the insulating base layer 3, as shown in FIG. 3(d).

Metal or resin is used as a semiconductive material for forming the semiconductive layer 5.

The metal such as metal oxide is used, for example. Examples of the metal oxide include chromium oxide, nickel oxide, copper oxide, titanium oxide, zirconium oxide, indium oxide, aluminum oxide, and zinc oxide, or chromium oxide is preferably used.

The method for forming the semiconductive layer 5 of metal oxide is not particularly limited. For example, the semiconductive layer 5 can be formed by a method of sputtering a metal as the target, then to oxidize by heat, as required, a method of reactive sputtering, or a method of sputtering a metal oxide as a target.

In the method of oxidizing a metal, as a target, after sputtering by heat as required, for example, a metal such as chromium is sputtered as a target by a sputtering method of introducing an inert gas such as argon gas as an introduced gas. Thereafter, the semiconductive layer 5 of metal oxide is formed by oxidizing by heating at 50 to 400° C. for 1 minute to 12 hours in the atmosphere using a heating furnace or the like, as required.

In the method of reactive sputtering, a metal such as chromium is sputtered as a target, for example, in a sputtering apparatus, and a reactive gas containing oxygen is introduced as an introduced gas to form the semiconductive layer 5 of metal oxide.

In the method of sputtering a metal oxide as a target, a metal oxide such as chromium oxide is sputtered as the target, for example, in a sputtering apparatus, and an inert gas such as argon gas is introduced as the introduced gas to form the semiconductive layer 5 of metal oxide.

This semiconductive layer 5 can be formed, for example, according to the description of Japanese Unexamined Patent Publication No. 2004-335700.

The resin that may be used includes, for example, a semiconductive resin composition in which conductive particles are dispersed.

The semiconductive resin composition contains, for example an imide resin or an imide resin precursor, conductive particles, and a solvent.

A known imide resin can be used as the imide resin. Examples of the imide resin include polyimide, polyether imide, and polyamide imide, or the like.

The imide resin precursor that may be used includes, for example, the imide resin precursor described in Japanese Unexamined Patent Publication No. 2004-35825. Examples of the imide resin precursor include a polyamic acid resin.

The conductive particle that may be used includes, for example, conductive polymer particles, carbon particles, metal particles, and metal oxide particles.

The conductive polymer particles that may be used includes, for example, particles of, such as polyaniline, polypyrrole, or polythiophene, or particles of a derivative thereof. Preferably, polyaniline particles are used. Doping using a doping agent imparts conductivity to the conductive polymer particles.

The doping agent that may be used includes, for example, p-toluenesulfonic acid, dodecylbenzenesulfonic acid, alkylnaphthalenesulfonic acid, polystyrenesulfonic acid, p-toluenesulfonic acid-novolak resin, p-phenolsulfonic acid-novolac resin, and β-naphthalenesulfonic acid-formalin condensate.

The doping agent may be previously added into a solvent in which conductive polymer particles are dispersed (dissolved). Alternatively, after the semiconductive layer 5 is formed, the suspension board with circuit 1 having the semiconductive layer 5 thus formed during production may be dipped in the solution of the doping agent.

The carbon particle that may be used includes, for example, a carbon black particles, for example, a carbon nanofiber.

The metal particles that may be used includes, for example, particles of, such as chromium, nickel, copper, titanium, zirconium, indium, aluminum, or zinc.

The metal oxide particles that may be used includes, for example, particles of, such as chromium oxide, nickel oxide, copper oxide, titanium oxide, zirconium oxide, indium oxide, aluminum oxide, or zinc oxide, or particles of a composite oxide thereof. More specifically, particles such as a composite oxide of indium and tin (ITO particles), or a composite oxide of tin and phosphorus (PTO particles) are used as the metal oxide particle.

These conductive particles can be used alone or in combination of two or more kinds. Preferably, the ITO particles are used.

The conductive particles have an average particle size in the range of, for example, 10 nm to 1 μm, or preferably 10 nm to 400 nm, or more preferably 10 nm to 100 nm. In the case where the conductive particles are composed of a carbon nanofiber, the diameter thereof is in the range of 100 to 200 nm, and the length thereof is in the range of 5 to 20 μm, for example. When the average particle size (diameter) is smaller than those listed above, the adjustment of the average particle size (diameter) may be difficult. Conversely, when the average particle size (diameter) is larger than those listed above, the conductive particles may be unsuitable for coating.

The solvent that may be used is not particularly limited as long as an imide resin or an imide resin precursor, and conductive particles can be dispersed (dissolved) therein. Examples of the solvent include an aprotic polar solvent, such as N-methyl-2-pyrrolidone (NMP), N,N-dimethylacetamide, N,N-dimethylformamide, and dimethyl sulfoxide. These solvents can be used alone or in combination of two or more kinds.

The semiconductive resin composition can be prepared by mixing the imide resin or the imide resin precursor, the conductive particle, and the solvent.

The mixing ratio of the conductive particles is, for example, 1 to 300 parts by weight, or preferably 5 to 100 parts by weight, based on 100 parts by weight of the imide resin or the imide resin precursor. A lower mixing ratio of the conductive particles than this range may result in insufficient conductivity. Conversely, a higher mixing ratio of the conductive particles than this range may impair the good coating property of the imide resin or the imide resin precursor.

The solvent is mixed such that the total volume of the imide resin or the imide resin precursor, and the conductive particles is in the range of, for example, 1 to 40% by weight (solids concentration), or preferably 5 to 30% by weight (solids concentration), based on the semiconductive resin composition. Either a lower or a higher solids concentration than the above range may cause difficulties in controlling to the intended coating thickness.

The semiconductive resin composition thus prepared is uniformly coated over the surface of the conductive pattern 4, the surface of the upper portion 13 of the ground connecting portion 7, the surface of the insulating base layer 3 exposed from the conductive pattern 4 and the surface of the upper portion 13 of the ground connecting portion 7, and the surface of the metal supporting board 2 exposed from the insulating base layer 3, for example, by a known coating method, such as a roll coating, gravure coating, spin coating, or bar coating method. Thereafter, the coated semiconductive resin composition is heated to dry at a temperature in the range of, for example, 60 to 250° C., or preferably 80 to 200° C., for example, for 1 to 30 minutes, or preferably for 3 to 15 minutes.

In the case where the semiconductive resin composition contains an imide resin precursor, the semiconductive resin composition is dried, and thereafter, heated at 250° C. or higher under reduced pressure to be cured (imidized).

Therefore, the semiconductive layer 5 can be formed continuously with the surface of the conductive pattern 4, the surface of the upper portion 13 of the ground connecting portion 7, the surface of the insulating base layer 3 exposed from the conductive pattern 4 and the surface of the upper portion 13 of the ground connecting portion 7, and the surface of the metal supporting board 2 exposed from the insulating base layer 3.

The semiconductive layer 5 thus formed has a thickness of, for example, 40 µm or less, or preferably 1 µm or less. Usually, the semiconductive layer 5 has a thickness of 3 nm or more.

The surface resistance value of the semiconductive layer 5 is set in a range of, for example, $10^5$ to $10^{13}$ Ω/□, preferably $10^5$ to $10^{11}$ Ω/□, or more preferably $10^6$ to $10^9$ Ω/□. When the surface resistance value of the semiconductive layer 5 is smaller than this range, malfunction of the electronic component mounted thereon may arise. Conversely, when the surface resistance value of the semiconductive layer 5 is larger than this range, electrostatic breakdown may not be prevented.

Then, in this method, the insulating cover layer 6 is formed on the semiconductive layer 5 in the above-mentioned pattern, as shown in FIG. 3(e).

The insulating cover layer 6 is composed of the same resin as that used for the insulating base layer 3, preferably a photosensitive synthetic resin, or more preferably, photosensitive polyimide.

The method for forming the insulating cover layer 6 in the above-mentioned pattern is not particularly limited and a known method is used. For example, a varnish of photosensitive resin (photosensitive polyamic acid resin) is coated over a surface of the semiconductive layer 5, and the coated varnish is dried to form a cover coating. Subsequently, the cover coating is exposed to light via a photomask, and then heated as required and developed to form the above-mentioned pattern. Then, for example, the pattern is heated at 250° C. or higher under reduced pressure, to be cured (imidized).

The insulating cover layer 6 thus formed has a thickness in the range of, for example, 1 to 40 µm, or preferably 1 to 7 µm.

Then, in this method, the semiconductive layer 5 exposed from the insulating cover layer 6 is removed by etching, as shown in FIG. 3(f). For example, as an etchant, an aqueous alkaline solution such as an aqueous potassium hydroxide solution is used, and wet etching is performed by a dipping or spraying method using the insulating cover layer 6 as an etching resist.

Therefore, the semiconductive layer 5 can be formed in the same position as the insulating cover layer 6 in plane view.

Thereafter, in this method, a metal plating layer, not shown, is formed on an upper surface of the terminal portion 8, if required. Then, as shown in FIG. 1, the metal supporting board 2 is cut out by chemical etching to form a gimbal 10, and also trimmed to obtain the suspension board with circuit 1.

This suspension board with circuit 1 comprises the semiconductive layer 5 so as to cover the conductive pattern 4, and the ground connecting portion 7 to be in contact with the metal supporting board 2 and the semiconductive layer 5.

Accordingly, the conductive pattern 4 is electrically connected with the metal supporting board 2 via the semiconductive layer 5 and the ground connecting portion 7, thereby allowing to efficiently remove the static electricity charged on the conductive pattern 4. Besides, the semiconductive layer 5 is electrically connected with the metal supporting board 2 via the ground connecting portion 7 without directly contacting the metal supporting board 2, thereby allowing to effectively prevent corrosion of the metal supporting board 2.

As a result, the electrostatic breakdown of the electronic components mounted thereon can be prevented reliably, and in addition, the corrosion of the metal supporting board 2 under a high temperature and high humidity atmosphere can be prevented effectively.

Further, in the suspension board with circuit 1, the ground connecting portion 7 can be provided with the conductive pattern 4 in the base opening 11 in the insulating base layer 3, so that the ground connecting portion 7 can be provided efficiently and reliably.

In the above explanation, one ground connecting portion 7 has been provided on a widthwise side of the wires 9. However, the arrangement and the number of the ground connecting portion 7 are not limited thereto, and can be appropriately selected depending on the purpose and application.

In the above explanation, the ground connecting portion 7 is formed in a generally rectangular shape in plane view. However, the shape is not limited thereto, and can also be formed in an appropriate shape such as, for example, in a generally circular shape in plane view.

EXAMPLE

While in the following, the present invention is described in further detail with reference to Example and Comparative Example, the present invention is not limited to any of them.

Example 1

A metal supporting board of a stainless foil of 20 µm thick was prepared (cf. FIG. 3(a)).

Subsequently, a varnish of photosensitive polyamic acid resin was uniformly coated over a surface of the metal supporting board using a spin coater. The coated varnish was then heated at 90° C. for 15 minutes to form a base coating. Thereafter, the base coating was exposed to light at 700 mJ/cm$^2$ via a photomask, and then heated at 190° C. for 10 minutes. The base coating thus heated was developed using an alkaline developer. Subsequently, the base coating was cured at 385° C. under the pressure reduced to 1.33 Pa, thereby forming an insulating base layer of photosensitive polyimide on the metal supporting board so as to correspond to a portion where a conductive pattern is formed and so as to form a base opening (cf. FIG. 3(b)). The insulating base layer thus formed had a thickness of 10 µm. The base opening had a rectangular shape in plane view having a width of 80 µm, and a length of 300 µm.

Next, a conductive pattern of a copper foil of 10 µm thick was formed on the upper surface of the insulating base layer in the form of a wired circuit pattern by an additive method. At the same time, a ground connecting portion of a copper foil was formed on the metal supporting board exposed from the base opening in the insulating base layer so that the lower portion was filled in the base opening in the insulating base layer and the upper portion thereof covered the edge of the base opening (cf. FIG. 3(c)). Both the upper portion and the lower portion of the ground connecting portion had a rectangular shape in plane view. The lower portion thereof had a width of 80 µm, and a length of 300 µm. The upper portion thereof had a width of 140 µm, a length of 360 µm, and a thickness of 10 µm.

Next, a sputtering coating of a thin chrome film was formed on the each surface of the conductive pattern, the ground connecting portion, the insulating base layer, and the metal supporting board by sputtering using chromium as a target.

The sputtering process was performed according to the method described in Japanese Unexamined Patent Publication No. 2004-335700 under the following conditions:

Target: Cr
Ultimate vacuum: $1.33 \times 10^{-3}$ Pa
Flow rate of introduced gas (Argon): $2.0 \times 10^{-3}$ m$^3$/h
Operating pressure: 0.16 Pa
Temperature of earth electrode: 20° C.
Sputtering time: 3 seconds.

Thickness of sputtering coating: 100 nm

Next, a semiconductive layer of a chromium oxide layer was formed by heating in the atmosphere at 125° C. for 12 hours, thereby oxidizing the surface of the sputtering coating of a thin chromium film (cf. FIG. 3(d)). The chromium oxide layer had a thickness of 100 nm.

The presence of the semiconductive layer of the chromium oxide layer was confirmed by ESCA. When the surface resistance value of the semiconductive layer thus formed was measured at a temperature of 25° C. and a humidity of 15% using a surface resistance measuring device (Hiresta-up MCP-HT450 available from Mitsubishi Chemical Corporation), the value was $1 \times 10^7$ Ω/□.

Next, the varnish of the photosensitive polyamic acid resin described above was uniformly coated over the surface of the semiconductive layer using a spin coater, and then heated at 90° C. for 10 minutes to form a cover coating having a thickness of 7 μm. Thereafter, the cover coating was exposed to light at 700 mJ/cm$^2$ via a photomask, and then heated at 180° C. for 10 minutes. The cover coating thus heated was then developed using an alkaline developer to pattern the cover coating. Subsequently, the cover coating was cured at 385° C. under the pressure reduced to 1.33 Pa. As a result of this, an insulating cover layer of photosensitive polyimide was formed on the semiconductive layer in the above-mentioned pattern (cf. FIG. 3(e)). The insulating cover layer had a thickness of 5 μm.

Next, the semiconductive layer exposed from the insulating cover layer was removed by wet etching using the insulating cover layer as an etching resist and using an aqueous potassium hydroxide solution (cf. FIG. 3(f)).

Thereafter, in this method, a metal plating layer was formed on the surface of the terminal portion. Then, the metal plating layer thus formed was cut out by chemical etching to form a gimbal, and also trimmed to obtain a suspension board with circuit (cf. FIG. 1).

Comparative Example 1

Figure 4:
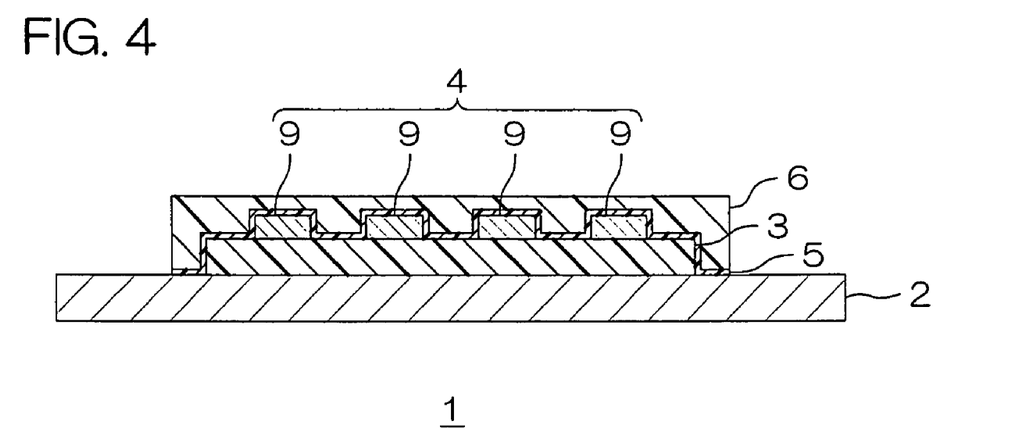
FIG. 4 is a sectional view of a suspension board with circuit of Comparative Example 1, in which a semiconductive layer directly contacts a metal supporting board.

The same procedures as in Example 1 were performed except that in the production of the suspension board with circuit in Example 1, the ground connecting portion was not provided, but the semiconductive layer was provided so as to directly contact the metal supporting board, to produce a suspension board with circuit (cf. FIG. 4).

That is, the semiconductive layer was formed in a widthwise direction thereof on the upper surface and the lateral side surface of the conductive pattern, the upper surface and the lateral side surface of the insulating base layer exposed from the conductive pattern, and the upper surface of the metal supporting board covered with the insulating cover layer.

(Evaluation)

Corrosion Resistance

A voltage of 3V was applied to the conductive patterns of the suspension board with circuits each obtained in Example 1 and Comparative Example 1 under the atmosphere of 85° C. and 85% RH for 500 hours. Thereafter, the corrosion states in their metal supporting boards were observed by cross sectional EDX (Energy Dispersive X-ray).

As a result, an element derived from the metal supporting board such as iron, nickel, or chromium was detected in Comparative Example 1. On the other hand, no element derived from the metal supporting board was detected in Example 1.

In the suspension board with circuit in Comparative Example 1, the semiconductive layer is in direct contact with the metal supporting board, whereby an electric current flows through the metal supporting board via the contact portion therebetween under a high temperature and high humidity atmosphere. Therefore, it is deduced that due to the dew condensation occurring in the metal supporting board and the electric current flowing into the contact portion, current corrosion develops, resulting in deposition of the element described above.

However, in the suspension board with circuit in Example 1, the semiconductive layer is not direct contact with the metal supporting board; is merely electrically connected with the metal supporting board via the ground connecting portion. Therefore, it is deduced that even if dew condensation occurs in the metal supporting board, the dew condensation does not reach the ground connecting portion, so that the electric current flowing into the ground connecting portion alone does not cause the current corrosion described above, resulting in no deposition of the element.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board comprising:
   a metal supporting board;
   an insulating base layer formed on the metal supporting board;
   a conductive pattern formed on the insulating base layer;
   a semiconductive layer formed on the insulating base layer so as to cover and be in contact with the conductive pattern; and
   a ground connecting portion formed of a conductor and disposed on the metal supporting board so as to be in contact with the metal supporting board and the semiconductive layer,
   wherein the semiconductive layer is electrically connected with the metal supporting board via the ground connecting portion without directly contacting the metal supporting board.

2. The wired circuit board according to claim 1, wherein a base opening extending in a thickness direction is formed in the insulating base layer, and the ground connecting portion is provided in the base opening.

3. The wired circuit board according to claim 1, wherein the ground connecting portion is formed of a material selected from at least one of copper, nickel, gold, solder, or alloys thereof.

4. The wired circuit board according to claim 2, wherein the base opening has a generally rectangular shape in a plane view.

5. The wired circuit board according to claim 2, wherein the ground connecting portion comprises a lower portion disposed in the base opening and an upper portion which projects beyond the base opening.

* * * * *